US008685201B2

(12) United States Patent
O'Rourke et al.

(10) Patent No.: US 8,685,201 B2
(45) Date of Patent: Apr. 1, 2014

(54) ASSEMBLIES AND METHODS FOR REDUCING WARP AND BOW OF A FLEXIBLE SUBSTRATE DURING SEMICONDUCTOR PROCESSING

(75) Inventors: Shawn O'Rourke, Tempe, AZ (US); Douglas Loy, Chandler, AZ (US); Hanqing Jiang, Chandler, AZ (US)

(73) Assignee: Arizona Board of Regents, a body corporate of the State of Arizona, Acting for and on Behalf of Arizona State University, Scottsdale, AZ (US)

( * ) Notice: Subject to any disclaimer, the term of this patent is extended or adjusted under 35 U.S.C. 154(b) by 301 days.

(21) Appl. No.: 12/921,896

(22) PCT Filed: Apr. 6, 2009

(86) PCT No.: PCT/US2009/039577
§ 371 (c)(1),
(2), (4) Date: Nov. 29, 2010

(87) PCT Pub. No.: WO2009/126544
PCT Pub. Date: Oct. 15, 2009

(65) Prior Publication Data
US 2011/0064953 A1    Mar. 17, 2011

Related U.S. Application Data

(60) Provisional application No. 61/043,223, filed on Apr. 8, 2008.

(51) Int. Cl.
*B32B 7/12*        (2006.01)
*C09J 7/02*        (2006.01)
*C09J 4/00*        (2006.01)
*C09J 101/00*      (2006.01)
*C09J 201/00*      (2006.01)
*B32B 27/00*       (2006.01)
*B32B 27/38*       (2006.01)

(52) U.S. Cl.
USPC ........ 156/327; 156/329; 156/330.9; 156/332; 428/414

(58) Field of Classification Search
USPC ............... 156/327, 329, 330.9, 332; 428/414
See application file for complete search history.

(56) References Cited

U.S. PATENT DOCUMENTS

| 6,108,210 | A  | * | 8/2000 | Chung | 361/747 |
|---|---|---|---|---|---|
| 6,413,353 | B2 | * | 7/2002 | Pompeo et al. | 156/307.3 |
| 6,784,555 | B2 | * | 8/2004 | Watson | 257/783 |
| 2003/0068841 | A1 |  | 4/2003 | Matsumura et al. |  |
| 2003/0111719 | A1 | * | 6/2003 | Reiss et al. | 257/684 |
| 2005/0031861 | A1 |  | 2/2005 | Matsumura et al. |  |
| 2006/0145340 | A1 | * | 7/2006 | Tseng et al. | 257/724 |
| 2009/0230568 | A1 | * | 9/2009 | Yasuda et al. | 257/787 |

FOREIGN PATENT DOCUMENTS

| CN | 2679972 | 2/2005 |
|---|---|---|
| EP | 0307050 | 3/1989 |
| EP | 1464688 | 10/2004 |
| EP | 1605491 | 12/2005 |
| EP | 1793421 | 6/2007 |
| JP | 10242086 | 9/1998 |
| JP | 2001031451 | 2/2001 |
| JP | 2001234129 | 8/2001 |
| JP | 2005280172 | 10/2005 |
| JP | 2007146121 | 6/2007 |
| WO | 2008005979 | 1/2008 |

OTHER PUBLICATIONS

Machine Translation of JP 2007-146121 A (2007).*

* cited by examiner

*Primary Examiner* — Michael Orlando
(74) *Attorney, Agent, or Firm* — McDonnell Boehnen Hulbert & Berghoff LLP

(57) ABSTRACT

Methods are described for addressing the bowing and/or warping of flexible substrates, attached to a rigid carrier, which occurs as a result of the thermal challenges of semiconductor processing. In particular, viscoelastic adhesives are provided which can bond a flexible substrate to a rigid carrier and mediate the thermal mismatch which often is present due to the distinctly different materials properties of most flexible substrates, such as plastic films, with respect to rigid carriers, such as silicon wafers. Assemblies are also provided which are produced according to the methods described herein.

20 Claims, No Drawings

ASSEMBLIES AND METHODS FOR REDUCING WARP AND BOW OF A FLEXIBLE SUBSTRATE DURING SEMICONDUCTOR PROCESSING

RELATED APPLICATIONS

This application claims priority to U.S. Provisional Application Ser. No. 61/043,223 filed Apr. 8, 2008, incorporated by reference herein in its entirety.

STATEMENT OF GOVERNMENT FUNDING

This work was supported at least in part by U.S. Army Research Labs (ARL) Grant No. W911NF-04-2-005. The U.S. Government has certain rights in this invention.

FIELD OF THE INVENTION

This invention generally relates to processing flexible substrates and more specifically to a method for reducing warp and bow of a flexible substrate during semiconductor processing.

BACKGROUND OF THE INVENTION

In the electronics industry, flexible substrates are quickly becoming popular as a base for electronic circuits. Flexible substrates can include a wide variety of materials including very thin layers of metal, such as stainless steel, any of a myriad of plastics, etc. Once a desired electronic component, circuit, or circuits are formed on a surface of the flexible substrate, the circuit can be attached to a final product or incorporated into a further structure. Typical examples of such products or structures are active matrices on flat panel displays, RFID tags on various commercial products in retail stores, a variety of sensors, etc.

One major problem that arises is stabilizing the flexible substrate during processing. For example, in a process of fabricating thin film transistors or thin film transistor circuits on a substrate, a large number of process steps are performed during which the substrate may be moved through several machines, ovens, cleaning steps, etc. To move a flexible substrate through such a process, the flexible substrate must be temporarily mounted in some type of carrier or a rigid carrier must be removably attached, so that the flexible carrier can be moved between process steps.

However, the relatively high coefficient of thermal expansion (CTE) for flexible substrates compared to inorganic silicon or glass substrates leads to significant CTE induced strain mismatch during temperature excursions including inorganic thin film transistor (TFT) processing. This phenomenon introduces significant bowing and warping and can lead to handling errors, photolithographic alignment errors, and line/layer defects. Therefore, there exists a need in the art to develop novel compositions and methodologies for attaching a flexible substrate to a rigid carrier to mediate the preceding limitations.

SUMMARY OF THE INVENTION

In a first aspect, the invention provides methods for preparing a semiconductor assembly comprising attaching a flexible substrate to a rigid support with an adhesive layer, wherein the adhesive layer comprises a viscoelastic polymer having a glass transition temperature less than 180° C. and a decomposition temperature greater than 220° C.

In a second aspect, the invention provides assemblies comprising a flexible substrate, a rigid support, and an adhesive layer, wherein the flexible substrate is attached to the rigid support with the adhesive layer between the flexible substrate and rigid support; and the adhesive layer comprises a viscoelastic polymer having a glass transition temperature less than 180° C. and a decomposition temperature greater than 220° C.

In a third aspect, the invention provides methods for flexible display processing comprising producing a flexible display and attaching the flexible display to a rigid substrate according to the first aspect of the invention, wherein the flexible substrate is the flexible display.

DETAILED DESCRIPTION OF THE INVENTION

The term "bowing" as used herein means the curvature of a substrate about a median plane. The term "warping" as used herein means the linear displacement of the surface of a substrate with respect to a line defined by the center of the substrate. For example, if a substrate is uniformly bowed than the warp is about twice the bow measurement.

The term "CTE matched material" as used herein means a material which has a coefficient of thermal expansion (CTE) which differs from the CTE of the referenced material by less than about 20%. Preferably, the CTEs differ by less than about 10%, 5%, 3%, or 1%.

The term "flexible substrate" as used herein means a free-standing substrate comprising a flexible material which readily adapts its shape. Preferably, the flexible substrate is a preformed flexible plastic substrate or a preformed flexible metal substrate. Preferred flexible metal substrates include FeNi alloys (e.g., INVAR™, FeNi, or FeNi36; INVAR™ is an alloy of iron (64%) and nickel (36%) (by weight) with some carbon and chromium), FeNiCo alloys (e.g., KOVAR™, KOVAR™ is typically composed of 29% nickel, 17% cobalt, 0.2% silicon, 0.3% manganese, and 53.5% iron (by weight), titanium, tantalum, molybdenum, aluchrome, aluminum, and stainless steel. Preferred flexible plastic substrates include polyethylene naphthalate (PEN), polyethylene terephthalate (PET), polyethersulfone (PES), polyimide, polycarbonate, and cyclic olefin copolymer. Such flexible substrates are preferably thin; for example, about 1 μm to 1 mm thick. More preferably, a flexible substrate is about 50 μm to 500 μm; even more preferably, about 50 μm to 250 μm.

The term "viscoelastic adhesive" as used herein means an adhesive which exhibits both viscous and elastic characteristics when undergoing deformation. For example, a viscoelasctic material resists shear flow and exhibits time dependent strain. Examples of viscoelastic adhesive include, but are not limited to, polyimides, polyacrylates, acrylics, urethanes, epoxies, phenolics, bis-maleimides, silicones, and siloxanes.

The term "double-sided adhesive tape" as used herein means any tape comprising a supporting backing with an adhesive material on each of the two opposing faces thereof. The adhesives on opposing faces can be the same or different, and include, for example but not limited to elastomeric, thermoplastic, thermosetting, pressure-sensitive, and/or light-curable adhesives (e.g., visible or UV). Examples of double sided adhesives include, but are not limited to, double sided powder coated silicone adhesives (Argon PC500 family), or high performance silicone adhesives (Adhesive Research Arcare 7876).

The term "stable" as used herein with respect to exposure of a material to a particular temperature means that the referenced material loses less than about 5% total weight by mass when maintained at that temperature under a nitrogen or argon atmosphere for a period of about 1 hour.

The present invention provides a method for preparing a semiconductor assembly comprising attaching a flexible substrate to a rigid support with an adhesive layer, wherein the adhesive layer comprises a viscoelastic polymer having a glass transition temperature less than 180° C. and a decomposition temperature greater than 220° C. Generally, the viscoelastic polymer comprises a polymer having a glass transition temperature ranging from about 25 to 180° C. Preferably, the glass transition temperature ranges from about 50 to 180° C., or 100 to 180° C. Further, the viscoelastic polymers of the present disclosure are stable under processing conditions exceeding 220° C. Preferred viscoelastic polymers are stable at temperatures ranging from about 220 to 400° C. In certain embodiments, the viscoelastic polymers are stable at temperatures ranging from about 220 to 300° C.

Further, the adhesive layer can have a coefficient of thermal expansion (CTE) greater than about 10 ppm/° C. In general, the CTE of the adhesive can range from about 10 to 1000 ppm/° C. In one embodiment, the adhesive layer may also outgas at a rate less than about $2 \times 10^{-4}$ Torr-liter/second. The adhesive layer outgassing can range from about $1 \times 10^{-10}$ to $2 \times 10^{-4}$ Torr-liter/second.

In particular, the viscoelastic polymer can comprise elastomeric, thermoplastic, or pseudothermoplastic saturated or unsaturated hydrocarbon, siloxane, or silicone polymers. Preferably, the viscoelastic polymer comprises acrylics, epoxies, phenolics, urethanes polyimides, or siloxanes. More preferably, the viscoelastic polymer comprises n-butylacrylate, polysiloxane, polysilicone or polyimide. In one embodiment, the viscoelastic polymer comprises n-butylacrylate. In one embodiment, the viscoelastic polymer comprises polysiloxane. In one embodiment, the viscoelastic polymer comprises polysilicone. In one embodiment, the viscoelastic polymer comprises polyimide.

To prepare an assembly comprising a flexible substrate, a rigid support, and an adhesive layer comprising the viscoelastic polymer, the adhesive layer can be deposited onto the rigid carrier or flexible substrate according to methods known to those skilled in the art. The adhesive layer can be deposited on the rigid carrier or flexible substrate using a solution of the adhesive material, and can be prepared according to any method known to those skilled in the art for preparing a layer from a solution. For example, the solution can be spray coated, drop cast, spin coated, webcoated, doctor bladed, or dip coated to produce an adhesive layer on the rigid carrier or flexible substrate. Alternatively, the adhesive layer can be extrusion coated or pre-form laminated onto the rigid carrier or flexible substrate. Preferably, the adhesive layer comprising the viscoelastic polymer is between about 1 μm and 40 μm thick, and more preferably between about 2 μm and 20 μm thick.

In certain embodiments, the layer can be formed on the rigid carrier by spin coating a solution, i.e., by dispensing the solution on a surface of the rigid carrier and spinning the carrier to evenly distribute the solution. One skilled in the art will understand that the thickness of the layer, produced by spin coating, can be controlled by selection of the concentration of the adhesive material in the solvent, the viscosity of the solution, the spinning rate, and the spinning speed.

The solution layer can be dried, prior to bonding of the flexible substrate or rigid carrier, to essentially remove any remaining solvent. This drying can be according to any method known to those skilled in the art provided the method does not cause deterioration of the substrate, carrier, and/or adhesive material. For example, the layer can be dried by heating the layer at a temperature in the range of approximately 80° C. to 180° C., and preferably, about 100° C. to 130° C. In another example, the layer can be dried by heating the layer in a vacuum at a temperature in the range of approximately 100° C. to 180° C. In yet another example, the layer can be dried by heating the layer at a temperature in the range of approximately 80° C. to 180° C., followed by heating the layer in a vacuum (e.g., less than about 1 Torr) at a temperature in the range of approximately 100° C. to 180° C. In either heating process, the layer can be heated for about 10 to 120 minutes until substantially all the solvent is removed. One skilled in the art will recognize that higher temperatures (e.g., up to 300° C.) can be used in any of the heating steps provided the adhesive material, flexible substrate, and/or rigid carrier remains stable during heating.

Alternatively, to prepare an assembly comprising a flexible substrate, a rigid support, and an adhesive layer, the adhesive layer can be deposited onto the back side of flexible substrate, followed by an optional drying and/or vacuum drying process, as discussed previously. Preferably, when the adhesive layer is formed on the flexible substrate, the layer is produced by spin coating of a solution of the adhesive followed by drying of the layer, as discussed previously.

The rigid carrier can comprise a semiconductor wafer, alumina, a glass, or a material CTE matched to the flexible substrate, as described herein. For example, the semiconductor wafer can comprise Si, and, in particular, Si(100) or Si(111). In a preferred embodiment, the rigid support comprises alumina. In another embodiment, the rigid support comprises a material CTE matched to the flexible substrate.

Typically, the flexible substrate can be a plastic substrate or metal substrate. Preferred plastic substrates include, but are not limited to, those substrates comprising polyethylene naphthalate (PEN), polyethylene terephthalate (PET), polyethersulfone (PES), polyimide, polycarbonate, cyclic olefin copolymer or mixtures thereof. Preferred metal substrates include, but are not limited to, those substrates comprising INVAR, KOVAR, titanium, tantalum, molybdenum, aluchrome, aluminum, or stainless steel. In certain embodiments, the flexible substrate comprises stainless steel. For example, when a stainless steel substrate is used according to the methods described herein, the rigid support comprises alumina.

The flexible substrate can be bonded to the rigid support with the adhesive layer in between, according to any methods known to those skilled in the art. In one embodiment, bonding the flexible substrate comprises heating the adhesive layer (either on the flexible substrate or the rigid carrier, supra) to a softened state, i.e., above the glass transition temperature ($T_g$) of the viscoelastic polymer, and contacting the flexible substrate with to the adhesive-coated carrier. The specific softening temperature for use in the present invention can be determined empirically based on the teachings herein, and depends upon the specific material used in adhesive layer. For example, $T_g$ can be determined using techniques such as, but not limited to, thermogravimetric analysis (TGA), thermomechanical analysis (TMA), differential scanning calorimetry (DSC), and/or dynamic mechanical analysis (DMA).

In one embodiment, the flexible substrate comprises stainless steel, the rigid support comprises alumina, and the adhesive layer comprises n-butylacrylate. In another embodiment, the flexible substrate comprises stainless steel, the rigid support comprises alumina, and the adhesive layer comprises polysiloxane. In another embodiment, the flexible substrate comprises stainless steel, the rigid support comprises alumina, and the adhesive layer comprises polysilicone. In another embodiment, the flexible substrate comprises stainless steel, the rigid support comprises alumina, and the adhesive layer comprises polyimide.

In further embodiments, the adhesive layer may comprise more than one constituent layer. For example, the adhesive layer can comprise a first layer comprising a viscoelastic polymer and a second layer formed over the viscoelastic polymer. For example, the second layer can comprise a metal or insulating material layer. Preferred metals include, but are not limited to, metals which can be deposited by sputtering, for example, aluminum, gold, and silver. Preferred insulating layers include those which can be deposited by plasma enhanced chemical vapor deposition (PECVD), such as SiN and $SiO_2$. Such metal films typically can have a thickness ranging from about 50 Å to about 10,000 Å. In certain embodiments, the thickness can range from about 100 Å to about 5000 Å, or about 500 Å to about 5000 Å, or about 1000 Å to about 5000 Å.

In yet further embodiments, the adhesive layer may comprise three or more constituent layers. For example, the adhesive layer can comprise a first layer comprising a viscoelastic polymer, as discussed previously, a second layer formed over the viscoelastic polymer, such as a metal or insulating layer, and a third layer formed over the metal film. In certain embodiments, the third layer can comprise a double-sided adhesive tape. Preferred metals include, but are not limited to, metals which can be deposited by sputtering, for example, aluminum, gold, and silver. Preferred insulating layers include those which can be deposited by plasma enhanced chemical vapor deposition (PECVD), such as, SiN and $SiO_2$. Such metal films typically can have a thickness ranging from about 50 Å to about 10,000 Å. In certain embodiments, the thickness can range from about 100 Å to about 5000 Å, or about 500 Å to about 5000 Å, or about 1000 Å to about 5000 Å.

In another embodiment, bonding the flexible substrate can comprise depositing a layer of a metal or insulating layer directly on the adhesive layer; positioning a double-sided adhesive directly on the metal or insulating layer; and positioning the substrate directly on the double-sided adhesive. Preferred metals include, but are not limited to, metals which can be deposited by sputtering, for example, aluminum, gold, and silver. Preferred insulating layers include those which can be deposited by plasma enhanced chemical vapor deposition (PECVD), such as, SiN and $SiO_2$. Preferred double sided adhesives include, but are not limited to, double sided powder coated silicone adhesives (Argon PC500 family), or high performance silicone adhesives (Adhesive Research Arcare 7876) or similar.

After bonding of the flexible substrate to the rigid support, one or more of any of a number of electronic can be constructed on a surface of the flexible substrate. For example, one or more thin film transistors, organic and/or inorganic light emitting diodes, electrode arrays, field effect transistors, passive structures, and combinations thereof. In other examples, a display architecture can be formed on the flexible substrate attached to a rigid carrier according to the methods described herein.

It has been unexpectedly been found that such viscoelastic polymers serve to mediate stresses and/or strains introduced into a flexible substrate due to a CTE mismatch between the overlying flexible substrate and the underlying rigid support. Notably, the viscoelastic polymers utilized herein minimize warping and/or bowing of the flexible substrate as a result of the thermal stresses and/or strains introduced during, for example, semiconductor manufacturing processes.

For example, the bowing and/or warping of a flexible substrate, when attached to a rigid support according to any of the preceding methods and embodiments, can be less than about 100 μm; preferably, the bowing and/or warping of a flexible substrate, when attached to a rigid support according to any of the preceding methods is less than about 75 μm; even more preferably, the bowing and/or warping of a flexible substrate, when attached to a rigid support according to any of the preceding methods is less than about 60 μm.

EXAMPLES

A variety of exemplary carriers were bonded to one of 2 exemplary flexible substrates (PEN or stainless steel (SS)) of thickness as recited in Table 1, using exemplary pressure sensitive, adhesives, which include acrylates, polyacrylates, and silicones. The adhesives include spin-on adhesives and adhesive tapes.

The resulting bow and flex data are provided in Table 1. This and similar data reveal that the smaller the CTE delta (difference) between carrier and flex material, the smaller the bow. Furthermore, the data demonstrate that viscoelastic adhesives reduce the amount of bow within a carrier/flex material system. For example, looking at the silicon/SS systems, ArClad (available from, for example, Adhesives Research, Glen Rocks, Pa.) has greater viscoelasticity than DCPC500 (available from, for example, ESD Tapes, Monrovia, Calif.), and yields less bow.

TABLE 1

Bow and Warp of Exemplary Carrier/Substrate/Flex material

| Carrier | Carrier CTE | Adhesive | Flex sub. | FS thick. (um) | FS CTE | Bow | Warp |
|---|---|---|---|---|---|---|---|
| Alumina | 7.6 | FX930 | PEN | 200 | 20-25 | 82.86 | 113.66 |
| Silicon | 3.5 | DCPC5000 | PEN | 125 | 20-25 | 137.71 | 160.9 |
| Silicon | 3.5 | FX930 | PEN | 125 | 20-25 | 159.4 | 180.93 |
| Silicon | 3.5 | DCPC500 | SS | 100 | 9-12 | >400 | >600 |
| Silicon | 3.5 | ARClad | SS | 100 | 9-12 | >150 | >200 |

| Carrier | CTE | Adhesive | FS | FS Th (um) | CTE | Bow | Warp |
|---|---|---|---|---|---|---|---|
| Alumina | 7.6 | FX930 | PEN | 200 | 20-25 | 82.86 | 113.66 |
| Silicon | 3.5 | DCPC5000 | PEN | 125 | 20-25 | 137.71 | 160.9 |
| Silicon | 3.5 | FX930 | PEN | 125 | 20-25 | 159.4 | 180.93 |
| Silicon | 3.5 | DCPC500 | SS | 100 | 9-12 | >400 | >600 |
| Silicon | 3.5 | ARClad | SS | 100 | 9-12 | >150 | >200 |

We claim:

1. A method for preparing a flexible substrate assembly comprising
   (a) attaching a flexible substrate to a rigid support with an adhesive layer, wherein the adhesive layer comprises a viscoelastic polymer having a glass transition temperature less than 180° C. and a decomposition temperature greater than 220° C., wherein the adhesive layer comprises n-butylacrylate, polysiloxane, polysilicone or polyimide;
   (b) forming one or more thin film transistors, organic light emitting diodes, inorganic light emitting diodes, electrode arrays, field effect transistors, passive structures and combinations thereof on a surface of the flexible substrate, and
   (c) removing the flexible substrate from the rigid support after step (b).

2. The method of claim 1, wherein the attaching comprises depositing the adhesive layer on a surface of the rigid support; and
   bonding the flexible substrate with the rigid support wherein the adhesive layer is between the rigid support and flexible substrate.

3. The method of claim 2, wherein the adhesive layer is deposited by spin-coating, spray-coating, extrusion coating or preform lamination.

4. The method of claim 1, wherein the adhesive layer has a coefficient of thermal expansion ranging from about 10 to about 1000 ppm/° C.

5. The method of claim 1, wherein the adhesive layer outgases at a rate less than $2 \times 10^{-4}$ Torr-liter/second.

6. The method of claim 1, wherein the rigid support comprises a semiconductor wafer, alumina, a glass, or a material CTE matched to the flexible substrate.

7. The method of claim 1, wherein the flexible substrate is a plastic substrate or metal substrate.

8. The method of claim 7, wherein the flexible substrate is a plastic substrate, and wherein the plastic substrate comprises polyethylene naphthalate (PEN), polyethylene terephthalate (PET), polyethersulfone (PES), polyimide, polycarbonate, cyclic olefin copolymer, or mixtures thereof.

9. The method of claim 7, wherein the flexible substrate is a metal substrate, and wherein the metal substrate comprises INVAR, KOVAR, titanium, tantalum, molybdenum, aluchrome, aluminum, stainless steel, or mixtures thereof.

10. The method of claim 1, further comprising, prior to bonding of the flexible substrate and the rigid carrier,
    forming an insulating layer or metal layer directly on the adhesive layer; and
    placing a double-sided adhesive tape directly on the insulating layer or metal layer.

11. The method of claim 10, wherein the method further comprises forming an insulating layer directly on the adhesive layer and placing a double-sided adhesive tape directly on the insulating layer, and wherein the insulating layer comprises $SiO_2$ or SiN.

12. The method of claim 10, wherein the method further comprises forming a metal layer directly on the adhesive layer and placing a double-sided adhesive tape directly on the metal layer, and wherein the metal layer comprises aluminum.

13. The method of claim 1, wherein the flexible substrate has a bow or warp of less than about 100 μm.

14. The method of claim 13, wherein the flexible substrate has a bow or warp of less than about 60 μm.

15. The method of claim 1, further comprising forming a display architecture on the flexible substrate.

16. The method of claim 1, wherein the adhesive layer comprises polysiloxane or polysilicone.

17. The method of claim 16, wherein the rigid support comprises a semiconductor wafer, alumina, a glass, or a material CTE matched to the flexible substrate.

18. The method of claim 17, wherein the flexible substrate is a plastic substrate or metal substrate.

19. The method of claim 18, wherein the flexible substrate is a plastic substrate, and wherein the plastic substrate comprises polyethylene naphthalate (PEN), polyethylene terephthalate (PET), polyethersulfone (PES), polyimide, polycarbonate, cyclic olefin copolymer, or mixtures thereof.

20. The method of claim 18, wherein the flexible substrate is a metal substrate, and wherein the metal substrate comprises INVAR, KOVAR, titanium, tantalum, molybdenum, aluchrome, aluminum, stainless steel, or mixtures thereof.

* * * * *